United States Patent
Liu

(10) Patent No.: US 7,545,857 B2
(45) Date of Patent: *Jun. 9, 2009

(54) RECEIVER ARCHITECTURE EMPLOYING LOW INTERMEDIATE FREQUENCY AND COMPLEX FILTERING

(75) Inventor: Bin Liu, Danville, CA (US)

(73) Assignee: Broadcom Corporation, Irvine, CA (US)

( * ) Notice: Subject to any disclaimer, the term of this patent is extended or adjusted under 35 U.S.C. 154(b) by 855 days.

This patent is subject to a terminal disclaimer.

(21) Appl. No.: 10/884,406

(22) Filed: Jul. 1, 2004

(65) Prior Publication Data

US 2004/0240596 A1    Dec. 2, 2004

Related U.S. Application Data

(63) Continuation of application No. 09/592,016, filed on Jun. 12, 2000, now Pat. No. 6,778,594.

(51) Int. Cl.
*H04B 1/38* (2006.01)
*H04B 1/10* (2006.01)

(52) U.S. Cl. .................... 375/222; 455/302

(58) Field of Classification Search ............ 375/222, 375/322, 312, 313, 324, 346, 350; 455/302, 455/304, 307, 319
See application file for complete search history.

(56) References Cited

U.S. PATENT DOCUMENTS

| | | |
|---|---|---|
| 4,696,055 A | 9/1987 | Marshall |
| 4,723,318 A | 2/1988 | Marshall |
| 5,469,126 A | 11/1995 | Murtojarvi |
| 5,715,529 A | 2/1998 | Kianush et al. |
| 5,812,823 A | 9/1998 | Kahle et al. |
| 5,926,646 A | 7/1999 | Pickett et al. |

(Continued)

FOREIGN PATENT DOCUMENTS

EP    0 797 292 A1    9/1997

(Continued)

OTHER PUBLICATIONS

Communication from the EPO dated Nov. 3, 2004 enclosing 1) European Search Report Application No. EP 01 25 0210, Search Completed dated Oct. 6, 2004, Munich; and 2) Abstract (total 4 pages).

(Continued)

*Primary Examiner*—Khai Tran

(57) ABSTRACT

A communications receiver architecture characterized by a relatively low intermediate frequency (IF) and a polyphase filter. The receiver includes an input amplifier coupled to a carrier signal. Respective I and Q demodulators are coupled to the output of the input amplifier. A quadrature local oscillator (LO) generator provides respective LO_I and LO_Q inputs to the I demodulator and LO_Q inputs to the I demodulator and to the Q demodulator. The quadrature LO generator is driven by a phase-locked LO, and the LO frequency is such that an IF of, in one embodiment, approximately 1 MHz results. The I demodulator and Q demodulator outputs are applied through respective A/D converters to a polyphase filter. The polyphase filter outputs are then processed by a digital I/Q demodulator. Although a low IF is not generally understood to promote the image rejection performance of a receiver, substantial image rejection is afforded by the polyphase filter, thereby enabling the receiver to be realized almost entirely as a monolithic integrated semiconductor device.

16 Claims, 5 Drawing Sheets

U.S. PATENT DOCUMENTS

| | | | |
|---|---|---|---|
| 5,974,306 | A | 10/1999 | Hornak et al. |
| 6,035,186 | A | 3/2000 | Moore et al. |
| 6,061,711 | A | 5/2000 | Song et al. |
| 6,278,870 | B1 | 8/2001 | Davie et al. |
| 6,347,123 | B1 | 2/2002 | Mathe et al. |
| 6,778,594 | B1 * | 8/2004 | Liu .......................... 375/222 |

FOREIGN PATENT DOCUMENTS

| | | |
|---|---|---|
| WO | WO 99/16179 | 4/1999 |

OTHER PUBLICATIONS

Minnis, B., et al. "A Low-IF, Polybase Receiver for DECT." ISCAS 2000, IEEE International Symposium on Circuits and Systems, vol. 1, May 2000, pp. 160-163.

Crols, J., et al., "Low IF Topologies for High-Performance Analog Front Ends of Fully Integrated Receivers." IEEE Transactions on Circuits and Systems II: Analog and Digital Signal Processing, IEEE, Inc., New York, US, vol. 45, No. 3, Mar. 1, 1998, pp. 269-282.

*Specification of the Bluetooth System—Core*; v1.0B; Dec. 1, 1999;pp. 1-1082.

*iAPX 86, 88, 186 and 188 User's Manual—Programmer's Reference*; 1985; Cover Page and pp. 3-1-3-6.

* cited by examiner

RECEIVER ARCHITECTURE EMPLOYING LOW INTERMEDIATE FREQUENCY AND COMPLEX FILTERING

CROSS-REFERENCE TO RELATED APPLICATION(S)

This application is a continuation of U.S. patent application Ser. No. 09/592,016, filed Jun. 12, 2000 now U.S. Pat. No. 6,778,594, the disclosure of which is hereby incorporated by reference herein.

This application contains subject matter which may be related to U.S. Pat. No. 6,560,449 issued May 6, 2003, U.S. Pat. No. 6,650,880 issued Nov. 18, 2003, and U.S. patent application Ser. No. 09/592,009 filed Jun. 12, 2000, the disclosure of each of which is hereby incorporated by reference herein.

BACKGROUND OF THE INVENTION

1. Field of the Invention

The invention relates to digital communications systems and, more particularly, to a receiver architecture that is characterized by a relatively low intermediate frequency (IF) section, followed by polyphase filter that results in enhanced image rejection, and a digital I/Q demodulator.

2. Description of the Related Art

Digital modulation and demodulation techniques incorporating I/Q (In-phase/Quadrature) modulators and demodulators are widely used in communication systems. I/Q demodulators are abundantly discussed in the technical literature. See, for example, Behzad Razavi, *RF Microelectronics*, Prentice Hall (1998) and John G. Proakis, *Digital Communications*, McGraw-Hill (1995). There exists also patent art related to the technology of I/Q modulation and demodulation: U.S. Pat. No. 5,974,306, entitled "Time-Share I/Q Mixer System With Distribution Switch Feeding In-Phase and Quadrature Polarity Inverters" to Hornak, et al; U.S. Pat. No. 5,469,126, entitled "I/Q Modulator and I/Q Demodulator" to Murtojarvi.

Examples of digital communications system applications that incorporate and standardize I/Q modulation and demodulation include the GSM (Global System for Mobile Communications), IS-136 (TDMA), IS-95 (CDMA), and EEEE 802.11 (wireless LAN). I/Q modulation and demodulation have also been proposed for use in Bluetooth wireless communication systems.

Bluetooth is a low-power radio technology being developed with a view to substituting a radio link for wire and cable that now connect electronic devices, such as personal computers, printers and a wide variety of handheld devices, including palm-top computers, and mobile telephones. The development of Bluetooth began in early 1998 and has been promoted by a number of telecommunications and computer industry leaders. The Bluetooth specification is intended to be open and royalty-free and is available to potential participants as a guide to the design and development of compatible products.

The Bluetooth system operates in the 2.4 GHz ISM (Industrial, Scientific, Medical) band, and devices equipped with Bluetooth technology are expected to be capable of exchanging data at speeds up to 720 Kbs at ranges up to 10 meters. This performance is achieved using a transmission power of 1 mw and the adoption of frequency hopping protocols to avoid interference. In the event that a Bluetooth-compatible receiving device detects a transmitting device within 10 meters, the receiving device will automatically modify its transmitting power to accommodate the range. The receiving device is also required to operate in a low-power mode as traffic volume abates, or ceases altogether.

Bluetooth devices are capable of interlinking to form piconets, each of which may have up to 256 traits, with one master and seven slaves active while others idle in standby nodes. Piconets can overlap, and slaves can be shared. In addition, a form of scatternet may be established with piconets overlapping, thereby allowing data to migrate across the networks.

The invention addressed herein is driven by the long-standing requirement, applicable with equal force to Bluetooth designs, to eliminate, or least minimize, the need for external filters commonly encountered in the design of contemporary double-conversion communications receivers. An example of the typical double-conversion receiver architecture is illustrated in FIG. 1. That architecture requires a first bandpass RF filter 21 disposed between antenna 10 and RF amplifier stage 20. A second bandpass RF filter couples the output of RF amplifier 20 to a first input of mixer 30. The primary function of RF bandpass filters 21 and 22 is to effect front-end selectivity, thereby enhancing the receiver's image response performance, as well as affording protection against spurious responses related to, for example, intermodulation and cross-modulation phenomena. However, because the selectivity provided by filters 21 and 22, in general, varies inversely with the insertion loss thereby caused, the level of selectivity attainable is limited by system design constraints. Furthermore, RF bandpass filters are not conveniently realizable in integrated circuit form. Consequently, the necessity of coupling outboard RF filters at strategic points to otherwise integrated receiver circuitry increases the manufacturing complexity and cost, as well as the physical size of the receiver.

With continued reference to the receiver architecture depicted in FIG. 1, the RF carrier is first converted to IF in mixer 30. The LO signal to mixer 30 is synthesized from a phase-locked oscillator that includes a VCO 50 and phase-locked loop (PLL) 40. The output of mixer 30 is coupled to an IF bandpass filter 31. The paramount functions of the IF bandpass filter are to establish channel selectivity and to define the noise bandwidth of the receiver. The output of IF bandpass filter 31 is coupled to the input of amplifier 60. The output of amplifier 60 is coupled to one input of demodulator 70. The-second input to modulator 70 is derived by processing the output of amplifier 60 through quad tank 61. The output of demodulator 70 is filtered by low-pass filter 71, and NRZ data is recovered in a bit slicer 80 that operates synchronously with the SCLK signal.

What is notable with respect to the above receiver architecture, and underscored in FIG. 1, is the necessary inclusion of no fewer than four outboard filters, BPFs 21, 22 and 31, and quad tank 61. These filter elements are not readily realizable with resort to contemporary integrated circuit technology. Bandpass RF filters 21 and 22 are frequently implemented with surface acoustic wave (SAW) devices, and the IF bandpass filter 31 often requires a crystal filter. Quad tank 61 may be predictably constructed from lumped passive circuit elements. It is readily appreciated that the necessary inclusion of these filter elements frustrate, or at least compromise, the objective of achieving a small, compact and easily transportable communications receiver. Accordingly, what is desired is a receiver architecture that satisfies system requirements such as selectivity, image rejection and noise figure, while limiting the dependence on non-integrable frequency-selective components.

SUMMARY OF THE INVENTION

The above and other objects, advantages and capabilities are achieved in one aspect of the invention by a communications receiver that comprises an amplifier for coupling to an input carrier signal; an I demodulator, coupled to the output of the amplifier; a Q demodulator, coupled to the output of the amplifier; a quadrature LO generator for coupling to an LO signal source, the quadrature LO generator providing an LO_I output to the I demodulator and providing an LO_Q output to the Q demodulator; a polyphase filter having a first input coupled to the output of the I demodulator and having a second input coupled to the output of the Q demodulator; a first A/D converter having an input coupled to a first output of the polyphase filter; a second A/D converter having an input coupled to a second output of the polyphase filter; and a digital I/Q demodulator having first and second inputs respectively coupled to the first and second outputs of the polyphase filter. In greater detail, a preferred embodiment of the communications receiver is designed to have a low IF, approximately 1 MHz; and the polyphase filter is constructed to have a first input node coupled to the output of the I demodulator; a second input node coupled to the output of the Q demodulator; a first output node coupled to the input of the first A/D converter; a second output node coupled to the input of the second A/D converter; a reference node; a plurality of interior nodes; a plurality of capacitive elements; and a plurality of gyrator elements, each having an associated input terminal and an associated output terminal; and wherein: (i) a respective capacitive clement is coupled between each input node and the reference node, between each output node and the reference node, and between each interior node and the reference node, and (ii) a gyrator element is coupled between the input nodes, between the output nodes, between each input node and one internal node, between each output node and one internal node.

In another aspect, the invention is intended to realize a method of digital demodulation, preferably effected through a single integrated-circuit device, and with minimal reliance on outboard frequency-selective elements, such as SAWs, crystal filters, and the like. The method comprises the steps: applying a carrier signal, at a frequency RF, to the respective signal inputs of an I demodulator and a Q demodulator; applying the outputs of a quadrature LO generator to the respective LO inputs of the I demodulator and the Q demodulator; coupling the output of the I demodulator to the I input of a polyphase filter; coupling the output of the Q demodulator to the Q input of a polyphase filter; performing an A/D conversion of the I output of the polyphase filter; performing an A/D conversion of the Q output of the polyphase filter; coupling the A/D-converted I and Q outputs of the polyphase filter to the inputs of a digital I/Q demodulator; and recovering data through tile operation of the I/Q demodulator. More specifically, the method contemplates conversion of the RF carrier to a relatively low F, approximately +1 MHz. In addition, the method, in a particularized embodiment, is predicated on the operation of a polyphase filter constructed to have a first input node coupled to the output of the I demodulator; a second input node coupled to the output of the Q demodulator; a first output node coupled to the input of the first A/D converter; a second output node coupled to the input of the second A/D converter; a reference node; a plurality of interior nodes; a plurality of capacitive elements; and a plurality of gyrator elements, each having an associated input terminal and an associated output terminal; wherein: (i) a respective capacitive element is coupled between each input node and the reference node, between each output node and the reference node, and between each interior node and the reference node, and (ii) a gyrator element is coupled between the input nodes, between the output nodes, between each input node and one internal node, between each output node and one internal node.

In further ramification, the invention resides in a mixer/demodulator for a communications receiver. The mixer/demodulator comprises an input terminal for a carrier signal at a carrier frequency; a local oscillator (LO) signal source; a quadrature LO generator coupled to the local oscillator signal source for providing an in-phase LO signal LQ_I, and a quadrature LO signal, LO_Q; an I mixer (13) having a carrier input coupled to the input terminal and an LO_I input coupled to the LO_I signal from the quadrature LO generator; a Q mixer (14) having a carrier input coupled to the input terminal and an LO_Q input coupled to the LO_Q signal from the quadrature LO generator; wherein: (i) the frequency of the LO_I signal is equal to the frequency of the LO_Q signal and that frequency is only slightly offset from the carrier frequency, and (ii) the LO_I signal and LO_Q signal have a predetermined phase relationship; filter means coupled to the output of the I mixer and to the output of the Q mixer for substantially reducing the response of the communications receiver to an image signal; and a digital I/Q demodulator coupled to the output of the filter means. In a particularized embodiment, the polyphase filter is constructed to have a first input node coupled to the output of the I demodulator; a second input node coupled to the output of the Q demodulator; a first output node coupled to the input of the first A/D converter; a second output node coupled to the input of the second A/D converter; a reference node; a plurality of interior nodes; a plurality of capacitive elements; and a plurality of gyrator elements, each having an associated input terminal and an associated output terminal; and wherein: (i) a respective capacitive element is coupled between each input node and the reference node, between each output node and the reference node, and between each interior node and the reference node, and (ii) a gyrator element is coupled between the input nodes, between the output nodes, between each input node and one internal node, and between each output node and one internal node.

BRIEF DESCRIPTION OF THE DRAWINGS

The subject invention may be better understood, and its numerous objects, features and advantages made apparent to those skilled in the art, with reference to the following Drawings, wherein.

DETAILED DESCRIPTION OF THE INVENTION

For a thorough understanding of the subject invention, reference is made to the following Description, including the appended claims, in conjunction with the above-described Drawings.

Figure 1:
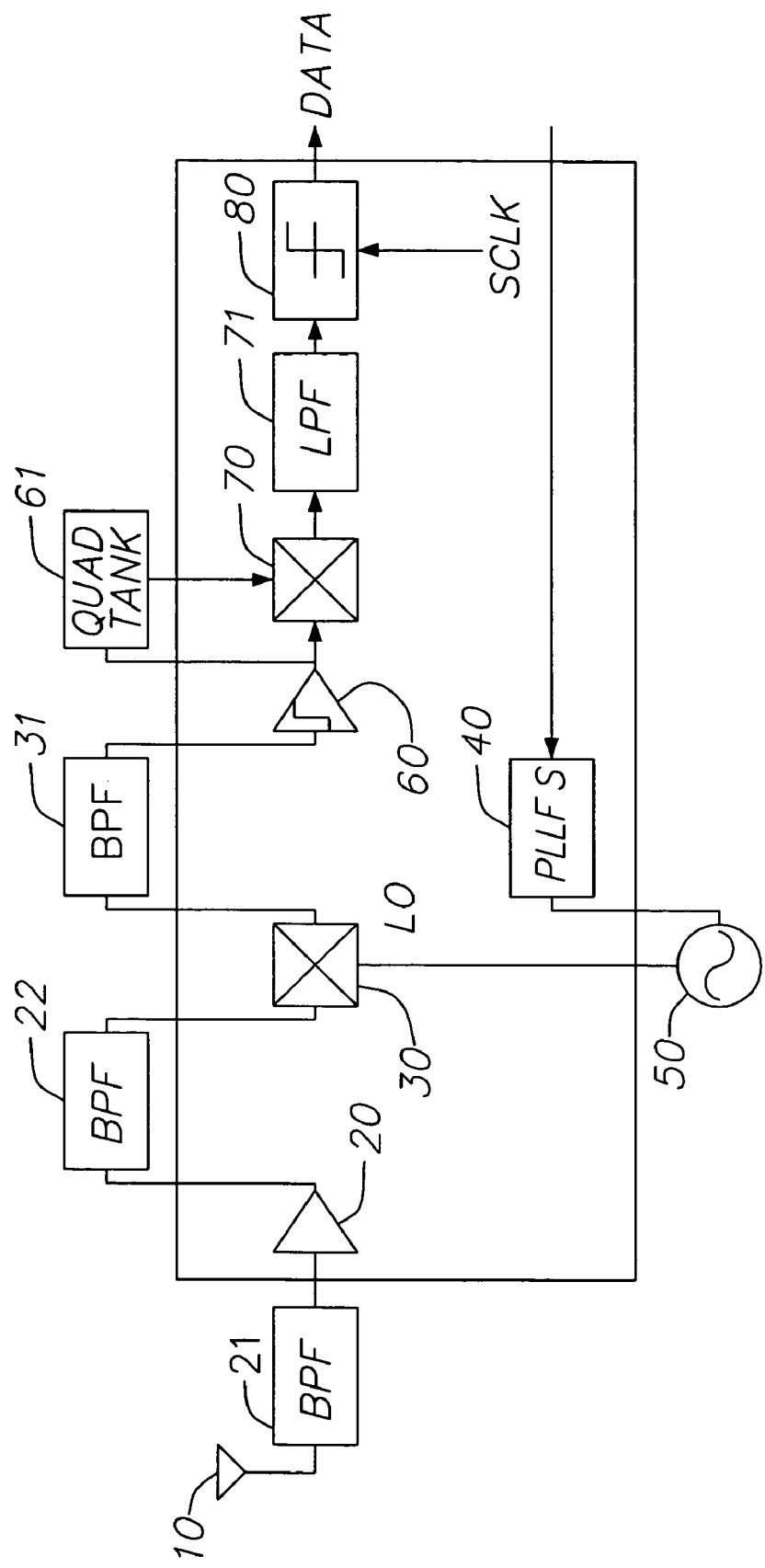
FIG. 1 is a block diagram of a conventional dual-conversion, digital communications receiver, illustrating the incorporation of non-integrable filters BPF 21, BPF 22 and BPF 23, as well as non-integrable quad tank 61.
Figure 2:
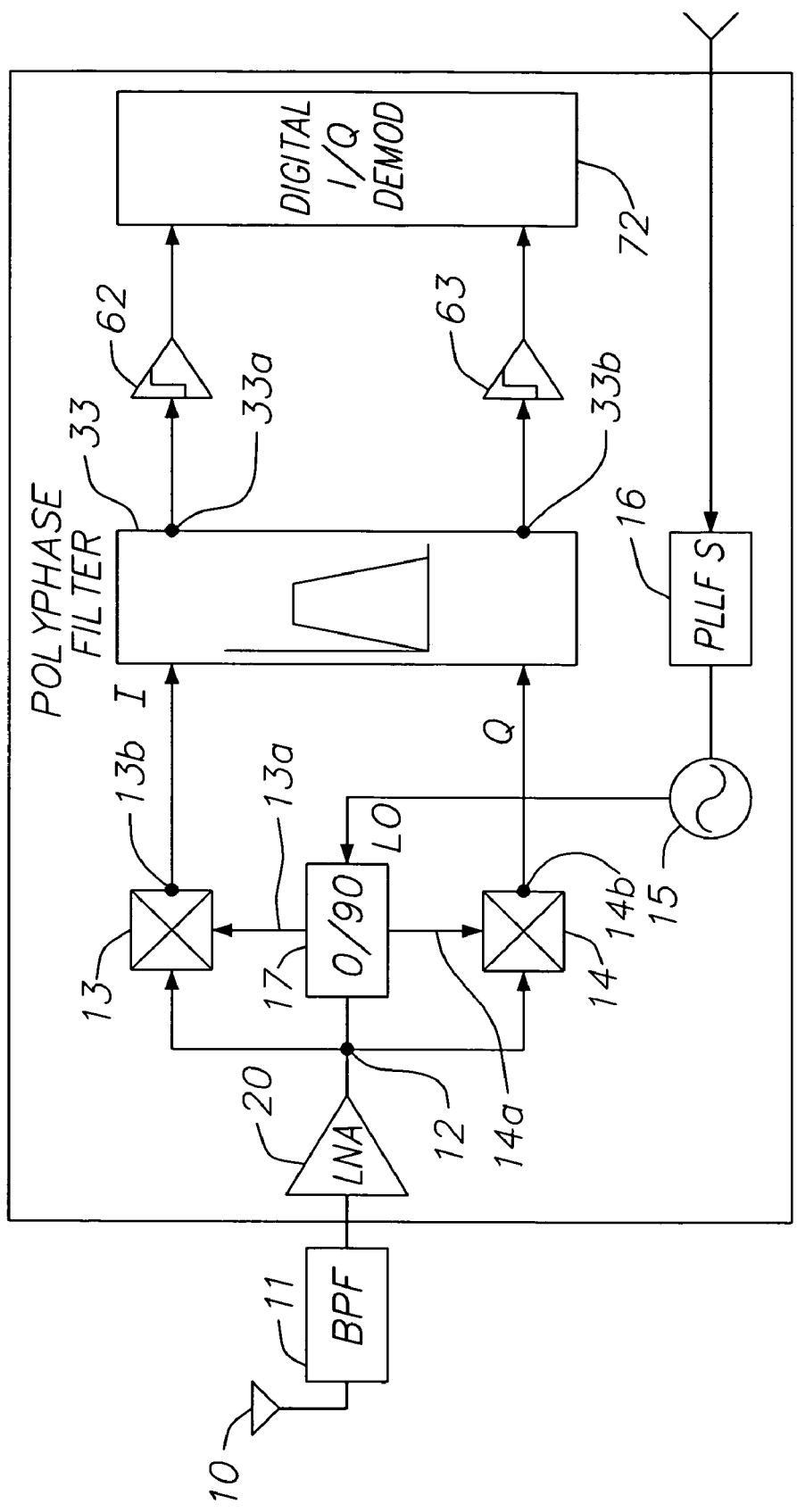
FIG. 2 is a block diagram of the subject receiver architecture incorporating a polyphase filter 33 and a low IF.

Referring now to FIG. 2, depicting a receiver architecture conforming to the subject invention, an antenna 10 is seen to couple an intercepted RF carrier to the input of RF BPF 11. BPF 11 may be fixed-tuned or tunable and will have a nominal center frequency at the anticipated RF carrier frequency. The bandwidth of BPF 11 will be designed as appropriate to the overall receiver system design requirements and constraints. One salient purpose of BPF 11 is to effect rejection of out-of-band RF signals, that is, rejection of signals at frequencies other than the frequency of the desired RF carrier. Front-end selectivity is an important factor in minimizing the receiver's susceptibility to intermodulation and cross-modulation interference. In addition, and contextually more relevant, BPF 11 selectivity contributes to the image-rejection characteristics of the receiver.

In general, image rejection refers to the ability of the receiver to reject responses resulting from RF signals at a frequency offset from the desired RF carrier frequency by an amount equal to twice the intermediate frequency (IF) of a dual-conversion receiver. For example, if the desired RF signal is at 100 MHz, and the receiver IF is 10.7 MHz, than the receiver local oscillator (LO) will be tuned to 89.3 MHz. However, as is well known to those skilled in the art, the receiver will also exhibit a response to undesired RF signals at frequency 10.7 MHz below the LO frequency, that is, at 78.6 MHz. The receiver's response to the 78.6 MHz signal is referred to as the image response, because the image signal resides at a frequency opposite the LO frequency from the desired RF carrier, and is offset from the LO frequency by a frequency 20 equal to the IF.

The output of BPF 11 is coupled to the input of a low-noise RF amplifier LNA 20. In general, LNA is primarily significant in that its noise figure is the predominant factor in determining the noise figure, and therefore the sensitivity, of the receiver. In addition, LNA imparts a level of amplification to the RF input signal that is necessary to effectively drive the mixer section of the receiver. The output of LNA 20 is coupled to the receiver mixer/demodulator input at terminal 12.

The mixer/demodulator includes a quadrature demodulator, including I demodulator 13 and Q demodulator 14. As is commonplace in contemporary receiver design, the receiver incorporates a digital, frequency-synthesized LO function, performed by a voltage-controlled oscillator (VCO) 15, driven by a phase-locked loop (PLL) 16. For a comprehensive exposition of digital frequency-synthesis techniques, see William F. Egan, *Frequency Synthesis by Phase Lock*, John Wiley & Sons, Inc., (2000). The LO signal is coupled to an input of a quadrature phase-shifter 17. In the receiver architecture presently contemplated, the operating frequency of the LO is selected to be offset from the desired RF carrier frequency by approximately 1 MHz, thereby resulting in a relatively low IF at 1 MHz. With respect to conventional receiver designs, a low IF is generally contraindicated when image rejection is an important consideration. However, in a manner to be described below, the subject receiver architecture achieves the benefits associated with a low IF, while satisfying image rejection requirements. Consistent with designs regularly invoked by artisans, phase-shifter 17 delivers an in-phase version of the LO, LO_I signal 13a, to I demodulator 13 and a quadrature (90° phase shifted) version of the LO, LO_Q signal 14a, to Q demodulator 14. The respective demodulated outputs of demodulators 13 and 14 constitute, respectively, the demodulated analog I and Q signals.

An advantage of the receiver architecture of FIG. 2 is that an ideal I/Q demodulation receiver is theoretically capable of infinite image rejection. However, the theoretical assumption is predicated on perfectly matched I and Q channels. Because state-of-the art semiconductor device design and fabrication technology does not admit of perfect matching between devices, even devices on the same die, some degree of mismatch between the I and Q channels is inevitable. In fact, the mismatch between devices on a semiconductor wafer is known to be dependent on the physical size of the devices. This dependency may be predicted by the following relationships that quantify the standard deviation in threshold voltage $\sigma_{Vt}$, and $\beta, \sigma_\beta$, for a MOS device:

$$\sigma_{Vt} = \frac{30(\text{millivolt}-\text{micrometer})}{\sqrt{WxL}}$$

and $$\sigma_\beta = \frac{0.09(\text{micrometer})}{\sqrt{WxL}},$$

where W×L is total area occupied by the device on the semiconductor die.

As is immediately apparent from the above, deviations in critical MOS device parameters vary inversely with to the area occupied by the device. Because lower frequencies of IF operation permit larger device geometries, mismatch in a receiver IF section tends to be ameliorated as the IF is reduced.

It has been empirically determined that contemporary semiconductor fabrication processes result in I channel and Q channel matching that limits image rejection to approximately 30 to 35 db. In systems implemented with CMOS technology, virtually mandatory when power consumption is a paramount design consideration, not even this level of performance is attainable. This detriment derives from the fact that CMOS devices tend to demonstrate less favorable matching characteristics. Inasmuch as a 35 db image rejection specification is considered marginal for most digital communications receiver applications, the problems confronted in a CMOS-based design are glaringly apparent.

The LO_I output, at terminal 13b, of I demodulator 13 is coupled to the I input of a polyphase filter 33. Similarly, the LO_Q output, at terminal 14b, of Q demodulator 14 is coupled to the Q input of the polyphase filter. The respective LO_I and LO_Q outputs are each centered at a frequency of 1 MHZ, but are 90° out of phase. As will be seen, incorporation of the polyphase filter into the receiver architecture results in excellent image rejection, not obtainable with simple filters, even though the IF is only 1 MHz. The salient aspect of the polyphase filter is that it enables the synthesis of a transfer function that discriminates between positive and negative frequencies. Of course, the frequency of the image signal, after conversion, is the negative of the frequency the desired frequency. A graphical representation of a polyphase filter transfer function is depicted in FIG. 3.

Figure 3:
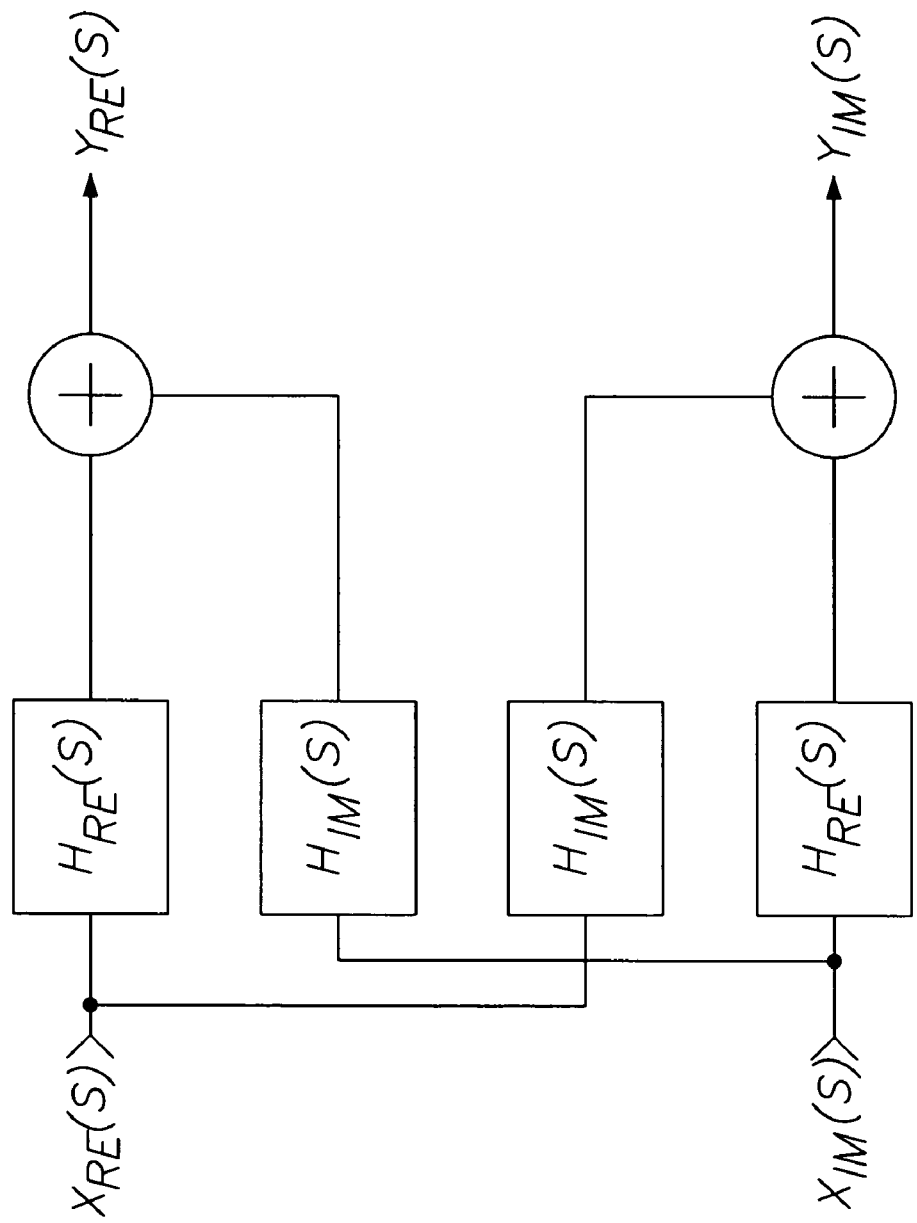
FIG. 3 is a graphical representation of a polyphase filter transfer function.

From FIG. 3, it may be seen that an input signal consisting of a real component, $X_{RE}(S)$, and an imaginary component, $X_{IM}(S)$, results in an output signal having a real component, $Y_{RE}(S)$, and an imaginary component, $Y_{IM}(S)$. The transfer function of the polyphase filter, graphically represented in FIG. 3, results in:

$$Y_{RE}(S)=X_{RE}(S)H_{RE}(S)+X_{IM}(S)H_{IM}(S)$$

$$Y_{IM}(S)=X_{RE}(S)H_{IM}(S)+X_{IM}(S)H_{RE}(S).$$

An example of an active polyphase filter arrangement is provided in U.S. Pat. No. 4,723,318, entitled "Active Polyphase Filters", to Christopher B. Marshall. The arrangement described therein obtains asymmetric poles and zeros in the filter transfer function through the use of feedback. Specifically, a first polyphase filter is included in a feedback path, and a second polyphase filter is included in a feedforward path. In operation, the loop gain at an image frequency can be designed to be much greater than unity, thereby making the feedforward path insensitive to mismatch. Alternatively, the loop gain at the image frequency can be made much less than unity, thereby making the feedback path insensitive to matching. Furthermore, it is known that a polyphase filter, with a transfer function generalized as immediately above, may be implemented, inter alia, as a passive, sequence-asymmetric RC network or as an array of cross-coupled gm-C filters. An example of the former implementation is contained in U.S. Pat. No. 6,560,449, issued May 6, 2003. See, for example, FIG. 4B and accompanying text therein. An example of the latter implementation, deemed preferred in the context of the subject invention, is provided in FIG. 4.

Figure 4:
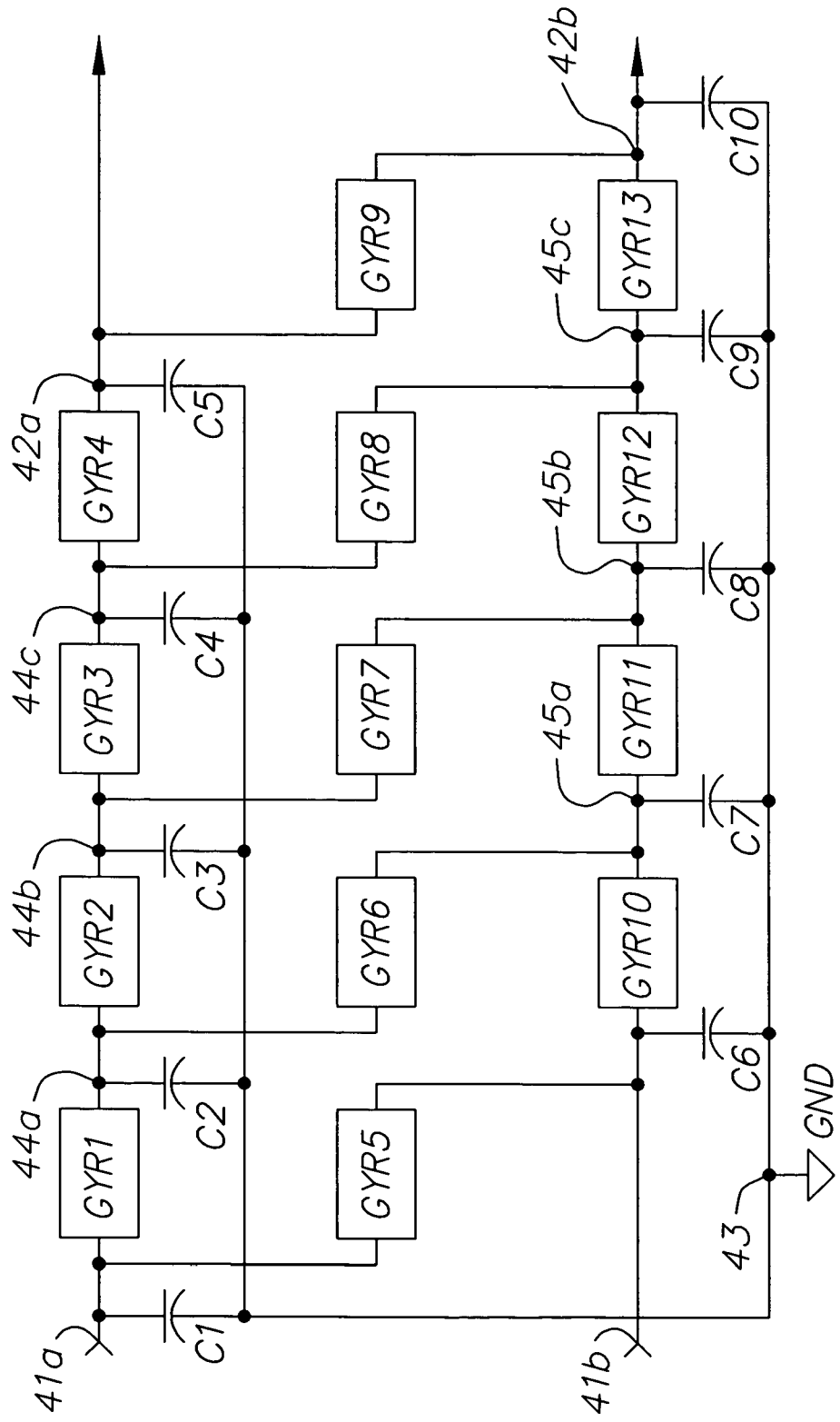
FIG. 4 is a circuit diagram of a preferred embodiment of a polyphase filter subject receiver architecture.

As may be seen in FIG. 4, polyphase filter 33 is constructed from an array of gyrators, GYR1 through GYR13, and capacitances C1 through C10, all of which may be integrated on the same semiconductor device. Gyrators are well known to those skilled in the art. The gyrator characteristic of paramount importance is the conversion of an impedance to its inverse. To wit: the gyrators of FIG. 4 operate, in part, to convert an associated capacitance into an equivalent inductance. The conversion factor is determined by the transconductance, gm, presented by the gyrator. The configuration of polyphase filter may be described as follows.

Polyphase filter 33 is coupled between a pair of input nodes, 41a and 41b, and a pair of output nodes, 42a and 42b, and has a reference, or GND, node, 43. Polyphase filter 33 also exhibits a number of interior nodes 44a, 44b, and 44c, and 45a, 45b, and 45c. Input node 41a is coupled to the output of I demodulator 13, and input node 41b is coupled to the output of Q demodulator 14.

The polyphase filter construction is also characterized by a capacitance (C1, C6) coupled between each input node and GND and a capacitance (C5, C10) coupled between each output node and GND. A capacitance is also coupled between each interior node and GND. To wit: C2 between node 44a and GND, C3 between node 44b and GND, C4 between 44c and GND, C7 between 45a and GND, C8 between 45b and GND, and C9 between 45c and GND. A gyrator, GYR5, couples the pair of input nodes 41a and 41b; and a gyrator, GYR9, couples the output nodes 42a and 42b. Interior nodes 44a, 44b, and 44c are sequentially series connected between input node 41a and output node 42a by gyrators GYR1, GYR2, GYR3 and GYR4, respectively. Interior nodes 45a, 45b, and 45c are, similarly, sequentially series connected between input node 41b and output-node 42b by gyrators GYR10, GYR11, GYR12 and GYR13, respectively. In addition, matched pairs of interior nodes are coupled by gyrators. Node 44a is coupled to node 45a by GYR6; node 44b is coupled to node 45b by GYR7; and node 4c is coupled to node 45c by GYR8.

Figure 5:
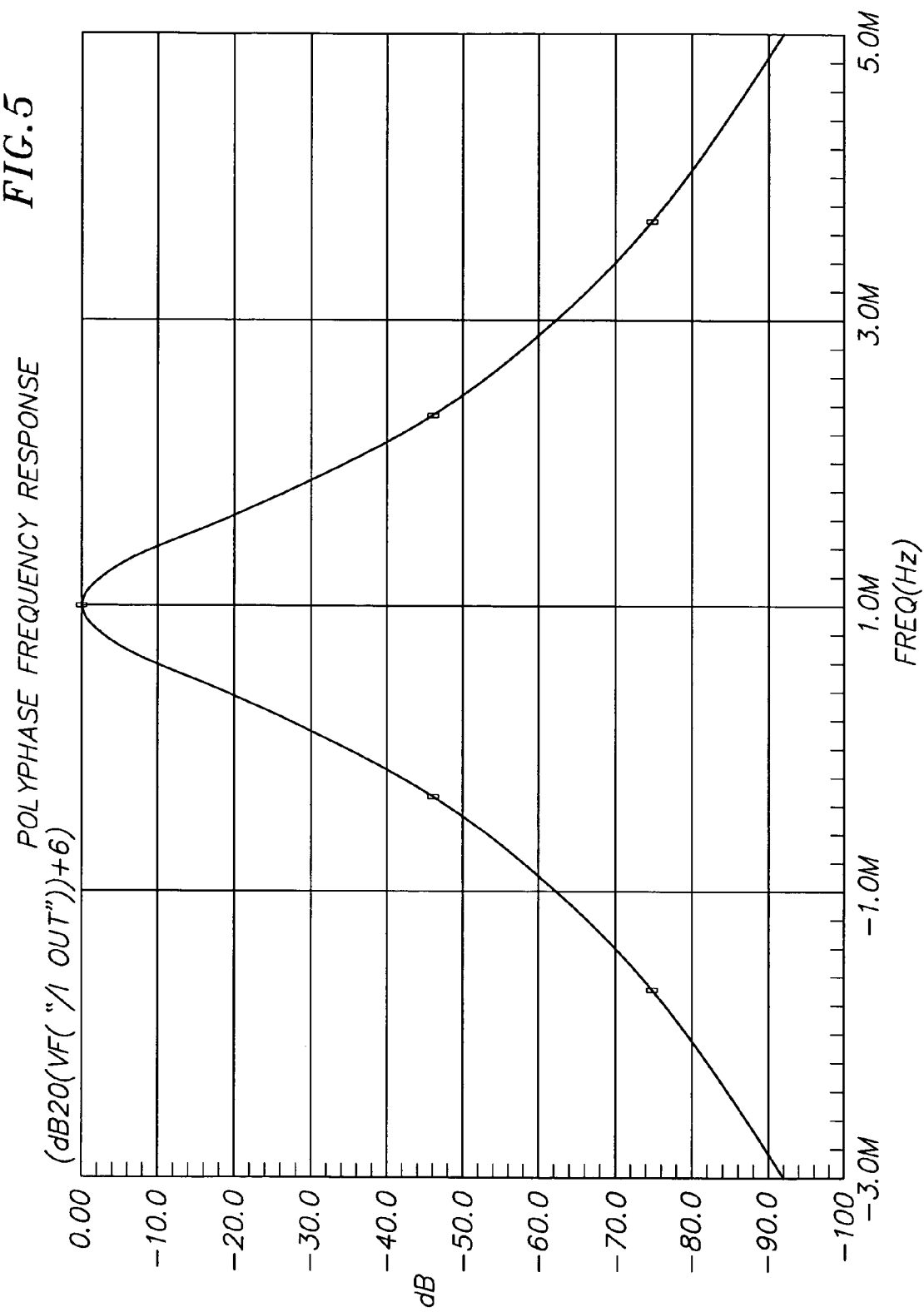
FIG. 5 depicts the frequency response of the polyphase filter of FIG. 4, wherein particular attention is to be paid to the filter response at the desired IF, +1 MHz, compared to the filter response at the image IF, −1 MHz; and wherein the use of the same reference symbols in different drawings indicates similar or identical items.

The polyphase filter configuration of FIG. 4 results in the frequency response depicted in FIG. 5. Note that the response due to the image signal, at −1 MHz, is 60 db below the response due to the desired signal at +1 MHz. Characteristics as indicated in FIG. 5 will be attainable to those skilled in the art of active filter design, with access to any of a number of available software-assisted design techniques.

Returning again to FIG. 2, the I output of polyphase filter 33, at terminal 33a, is coupled to an input of A/D converter 62. Similarly, the Q output the polyphase filter, at terminal 33b, is coupled to an input of A/D converter 63. The respective outputs of the A/D converters are coupled to the inputs of a digital I/Q demodulator 72 that recovers NRZ in a manner well known to those skilled in the art.

Although the subject invention has been described in detail in the context of and with the reliance on and of reference to, the exemplary embodiments presented above, the invention is not to be circumscribed by the described embodiments, but is to be afforded a scope commensurate with the appended claims, and substantial equivalents thereof. Those having ordinary skill in the art may readily comprehend various additions, modifications and improvements to the described embodiments of the invention, and all such modifications are to be deemed within the scope of the invention. Specifically, although the invention teaches the combination of a low IF and polyphase filter to attain the salutary joint effect of acceptable image rejection accompanied by minimal requirement for outboard, non-integrable filter stages, it should be understood that the term "low IF" is to be construed contextually, and not limited to 1 MHZ, as described above. In fact, it may well be that in some manifestations of the inventive concept, an IF of 1 MHZ may be regarded as conventional or, in some sense, "high". The point being that an IF is considered low or high primarily with reference to the anticipated frequency of the desired carrier signal, but also with reference to the prevailing state of semiconductor device fabrication processes. For example, if the anticipated carrier frequency is 100 HZ, then a 1 MHZ IF is low in that an image signal is only 2 MHz offset from the desired carrier. Conventional filters having a nominal center frequency of 100 MHz, for example, are not, without resort to extraordinary measures, likely to exhibit a degree of selectivity that will substantially attenuate an image signal merely 2 MHz (2%) off center. In this first attribute, the IF is "low". In a second attribute, the IF is low if the then-prevailing semiconductor fabrication techniques result in appreciably more precise device matching than is characteristic at frequencies that are, therefore, not "low".

With respect to the polyphase filter, it is nearly truistic to caution that unless specifically so claimed, the invention is not to be limited to a polyphase filter configuration described above. Nor must the filter achieve the image rejection indicated above. The operative criterion is that the filter discriminate between the desired IF and the image, and that it provide the level of attenuation of the image that is appropriate to the overall system design.

Furthermore, although the art recognizes the use of polyphase filters as a vehicle for image rejection, see, for example U.S. Pat. No. 5,974,306, entitled, "Time-Share I/Q Mixer System With Distribution Switch Feeding In-Phase and Quadrature Polarity Inverters," to Hornak et al., that art does not teach or recognize the arguably synergistic results offered by a receiver architecture based on both low IF and polyphase filtering.

What is claimed is:

1. A communications receiver comprising:

an RF amplifier for coupling to an input RF carrier signal;

an I demodulator, directly coupled to the output of the RF amplifier;

a Q demodulator, directly coupled to the output of the RF amplifier;

a quadrature LO generator for coupling to an LO signal source, the quadrature LO generator providing an LO_I output to the I demodulator and providing an LO_Q output to the Q demodulator;

a polyphase filter having a first input directly coupled to the output of the I demodulator and having a second input directly coupled to the output of the Q demodulator;

a first A/D converter having an input coupled to a first output of the polyphase filter;

a second A/D converter having an input coupled to a second output of the polyphase filter; and a digital I/Q demodulator having first and second inputs respectively coupled to an output of the first A/D converter and an output of the second A/D converter.

2. A communications receiver as defined in claim 1, wherein the polyphase filter has nominal center frequency of approximately +1 MHz.

3. A communications receiver as defined in claim 1, wherein the frequency of the LO_I output of the quadrature LO generator is substantially equal to the frequency of the LO_Q output of the quadrature LO generator and these frequencies are offset approximately 1 MHz from a carrier frequency of the input RF carrier signal.

4. A communications receiver as defined in claim 3, wherein the polyphase filter has a nominal center frequency of approximately +1 MHz.

5. A communications receiver as defined in claim 4, wherein the polyphase filter exhibits a frequency response such that the response at −1 MHz is approximately −60 db with respect to the response at +1 MHz.

6. A communications receiver as defined in claim 1, wherein the quadrature LO generator is adapted to generate LO_I and LO_Q signals that are offset from a carrier frequency of the RF carrier signal such that the I demodulator and the Q demodulator generate low intermediate frequency signals.

7. A method of digital demodulation, the method comprising:

applying an RF carrier signal, at a frequency RF, to respective signal inputs of an I demodulator and a Q demodulator;

applying outputs of a quadrature LO generator to respective LO inputs of the I demodulator and the Q demodulator;

coupling an output of the I demodulator directly to an I input of a polyphase filter;

coupling an output of the Q demodulator directly to a Q input of a polyphase filter;

performing an A/D conversion of the I output of the polyphase filter;

performing an A/D conversion of the Q output of the polyphase filter;

coupling the A/D converted I and Q outputs of the polyphase filter to inputs of a digital I/Q demodulator; and recovering data through the operation of the digital I/Q demodulator.

8. A method of digital demodulation as defined in claim 7, wherein the outputs of the quadrature LO generator are offset in frequency by 1 MHz from the frequency RF.

9. A method of digital demodulation as defined in claim 8, wherein the polyphase filter has a nominal center frequency of +1 MHz.

10. A method of digital demodulation as defined in claim 9, wherein the frequency response of the polyphase filter at −1 MHz is −60 db with respect to the frequency response of the polyphase filter at +1 MHz.

11. A method of digital demodulation as defined in claim 7, comprising generating LO_I and LO_Q signals that are offset from the frequency RF such that the outputs of the I demodulator and the Q demodulator provide low intermediate frequency signals.

12. A mixer/demodulator for a communications receiver, the mixer/demodulator comprising:

an input terminal for an RF carrier signal at an RF carrier frequency;

a local oscillator (LO) signal source;

a quadrature LO generator coupled to the local oscillator signal source for providing an in-phase LO signal, LO_I, and a quadrature LO signal, LO_Q;

an I mixer having an RF carrier input coupled to the input terminal and an LO_I input coupled to the LO_I signal from the quadrature LO generator;

a Q mixer having an RF carrier input coupled to the input terminal and an LO_Q input coupled to the LO_Q signal from the quadrature LO generator;

wherein: (i) the frequency of the LO_I signal is equal to the frequency of the LO_Q signal and that frequency is only slightly offset from the RF carrier frequency, and (ii) the LO_I signal and LO_Q signal have a predetermined phase relationship;

filter means directly coupled to an output of the I mixer and to an output of the Q mixer for substantially reducing the response of the communications receiver to an image signal; and a digital I/Q demodulator coupled to the output of the filter means.

13. A mixer/demodulator as defined in claim 12, wherein the digital I/Q demodulator is coupled to an I output of the filter means through a first A/D converter and is coupled to a Q output of the filter means through a second A/D converter.

14. A mixer/demodulator as defined in claim 12, wherein the filter means is a polyphase filter that discriminates between an IF signal resulting from a desired RF carrier signal and an IF signal resulting from an image of the desired carrier signal.

15. A mixer/demodulator as defined in claim 14, wherein the polyphase filter exhibits a response to the IF signal resulting from the image signal that is at least 20 db below a response the polyphase filter exhibits to the IF signal resulting from the desired RF carrier.

16. A mixer/demodulator as defined in claim 12, wherein the frequency of the LO_I and LO_Q signals is offset from the RF carrier frequency by either less than approximately 10% of the RF carrier frequency or, approximately 1 MHZ, whichever is greater.

* * * * *